(12) United States Patent
Sander

(10) Patent No.: US 7,339,393 B2
(45) Date of Patent: Mar. 4, 2008

(54) GATE DRIVE CIRCUIT FOR AN INSULATED GATE POWER TRANSISTOR

(75) Inventor: Rainald Sander, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/299,305

(22) Filed: Dec. 9, 2005

(65) Prior Publication Data
US 2006/0164117 A1    Jul. 27, 2006

(30) Foreign Application Priority Data
Dec. 10, 2004 (DE) ............ 10 2004 059 643

(51) Int. Cl.
*G01R 31/26* (2006.01)
(52) U.S. Cl. .............. 324/766; 324/765; 324/769
(58) Field of Classification Search .......... 324/766, 324/765

See application file for complete search history.

(56) References Cited

U.S. PATENT DOCUMENTS

| | | | | |
|---|---|---|---|---|
| 5,770,947 A | * | 6/1998 | Brauchle | 324/765 |
| 6,864,702 B1 | * | 3/2005 | Teggatz et al. | 324/769 |
| 2004/0051553 A1 | * | 3/2004 | Manna et al. | 324/766 |
| 2006/0164114 A1 | * | 7/2006 | Cirkel et al. | 324/765 |

FOREIGN PATENT DOCUMENTS

| | | |
|---|---|---|
| EP | 0 869 370 B1 | 7/2003 |
| WO | WO 95/10785 A1 | 4/1995 |

* cited by examiner

*Primary Examiner*—Minh N. Tang
(74) *Attorney, Agent, or Firm*—Maginot, Moore & Beck

(57) ABSTRACT

The invention relates to a gate drive circuit for, and in combination with, an insulated gate power transistor. The drive circuit is connected to the gate terminal of the transistor for the purpose of supplying a gate drive signal and being combined with the power transistor in the same chip housing. The drive circuit is set up to carry out a test mode which has been adapted for the purpose of testing the quality of the gate oxide of the power transistor.

27 Claims, 3 Drawing Sheets

GATE DRIVE CIRCUIT FOR AN INSULATED GATE POWER TRANSISTOR

BACKGROUND

The invention relates to a gate drive circuit for, and in combination with, an insulated gate power transistor.

In the case of power transistors, for example MOS transistors or IGBTs, which have a large areal extent, it is important to explicitly test the quality of the gate oxide in the product. To this end, there are corresponding gate stress tests in the front end and back end processes of semiconductor fabrication in order to safeguard the quality of this oxide. It is more difficult to carry out tests in integrated circuits which comprise a power transistor, for example a power MOS transistor. In order to carry out the quality test on the gate oxide, in the case of monolithic chips, a corresponding contact pad is routed to the outside in order to carry out the gate stress test in the front end process. A test is no longer required in the back end process since the gate oxide can no longer be damaged during installation since it is no longer possible to directly access the gate oxide electrically.

If, however, the driving logic unit and the power transistor are installed in a common housing in chips (dies) which are separate from one another, the situation is different. In the front end process, the separate chips can be tested in a known manner, especially the power transistor and the quality of its gate oxide. In the back end process, these chips are processed separately and are electrically connected to one another and to the leadframe. During processing, however, the gate oxide of the power transistor may now be damaged, for example as a result of electrical discharges or in the case of poorly grounded machines which have direct electrical contact with the gate oxide during processing. The entire structure is then surrounded with molding compound and the gate oxide of the power transistor is then no longer directly accessible from the outside. If this gate oxide of the large power transistor has been damaged, then, during processing in the back end process, it is no longer possible to carry out a direct quality test on the gate oxide since the gate itself is no longer electrically accessible. Only indirect tests are then possible in this case. If the gate oxide has been damaged, the gate is no longer insulated with respect to the source electrode and drain electrode or collector electrode and emitter electrode but rather there is an electrical connection across the oxide.

In principle, a plurality of test modes are available in the back end process, said test modes being able to detect the damage to the oxide. These include the measurement of the charging and discharging times of the power transistor which are affected by the damage to the oxide. However, these tests have the disadvantage that they can detect only coarse gate oxide errors with a large fault current since they are not sensitive enough to detect small initial damage to the gate oxide with a small fault current. During long-term operation, such small damage to the gate oxide may result in uncontrollable failure of the power transistor.

It would therefore be advantageous to specify a gate drive circuit of the generic type which makes it possible to detect such initial damage to the gate oxide in good time.

SUMMARY

As described herein, the drive circuit is set up to carry out a test mode which has been adapted for the purpose of testing the quality of the gate oxide of a power transistor.

In accordance with a first exemplary embodiment of the invention, the gate drive circuit has a first switch for applying a test voltage pulse to the gate terminal of the power transistor during a particular period of time, the voltage amplitude of the test voltage pulse being higher than the amplitude of a gate voltage pulse that is applied during normal operation of the power transistor. With this measure, the gate drive circuit is set up to carry out a gate stress test on the gate of the power transistor by applying an increased voltage pulse to the gate for a particular period of time. This gate drive circuit corresponding to the first exemplary embodiment preferably has an internal pulse generator for generating the test voltage pulse and means for activating the first switch and the pulse generator in the test mode in response to an externally applied test mode signal.

In accordance with a second exemplary embodiment, the gate drive circuit may have a test pulse terminal which leads outside the chip housing and is intended to supply the test voltage pulse from a pulse generator which is provided outside the common chip housing. In accordance with this second exemplary embodiment, the gate drive circuit also has means for activating the first switch in the test mode in response to an externally applied test mode signal. In comparison with the first exemplary embodiment, the voltage pulse is thus externally supplied via an external leg in the test mode and is applied to the gate by activating the first switch. The flexibility of the second exemplary embodiment is thus increased in comparison with the first exemplary embodiment.

Both in the first exemplary embodiment and in the second exemplary embodiment, provision may be made for the test voltage pulse to be supplied in a pulse train having a respective variable pulse voltage amplitude. Since, in the case of a damaged gate oxide, for example in the case of a power MOS transistor, the gate-drain capacitance $C_{GD}$ and/or the gate-source capacitance $C_{GS}$ of the power transistor is/are changed, this change can be detected in the test mode, for example by measuring the drain-source current $I_{DS}$ of the power transistor.

A third exemplary embodiment uses the possibility of changing the output impedance of the gate drive circuit in such a manner that the sensitivity for detecting initial damage to the gate oxide is considerably increased. This principle is based on the fact that an initially damaged gate oxide of the power transistor has a leakage current. If a current which is as small as possible is selected in the gate drive circuit for the purpose of charging and/or discharging the gate, it is possible to detect a smaller oxide fault current from the gate to the source or from the gate to the drain (gate to the collector or gate to the emitter). To this end, a test mode which reduces the charging and/or discharging currents at the gate is implemented in the gate drive circuit.

In accordance with this principle, in the third exemplary embodiment, the gate drive circuit has a first switch and a second switch, a first variable current source which can be switched on using the first switch and is connected to the gate terminal for the purpose of supplying a switch-on current having an adjustable small current intensity, and a second variable current source which can be switched on using the second switch and is likewise connected to the gate terminal for the purpose of supplying a switch-off current having an adjustable small current intensity, means for respectively activating the first and second switches, and means which are respectively provided for the purpose of adjusting the current intensities of the switch-on current supplied by the first variable current source and of the switch-off current supplied by the second variable current source. In this case, the means which adjust the current intensity in the gate drive circuit corresponding to the third exemplary embodiment adjust the current intensity of the switch-on current supplied by the first variable current source and the current intensity of the switch-off current supplied by the second variable current source in the test mode such that said current intensities are much smaller than the current intensities of a respective switch-on current and switch-off current during normal operation of the power transistor. The first variable current source which is switched on using the first switch is thus used to switch on the power transistor. The switch-on current supplied by the first variable current source is drastically reduced for test purposes. If the intrinsic gate-source (emitter) capacitance of the power transistor has been initially damaged, the switched-on time is considerably lengthened, or, if the gate-drain capacitance has been initially damaged, the switched-on time is considerably shortened.

In a similar manner, the current intensity of the second variable current source which is used to switch off the power transistor is greatly reduced, thus considerably shortening the switched-off time of the power transistor if the gate-source capacitance of the latter has initially been damaged or considerably lengthening the switched-off time of the power transistor if the gate-drain capacitance of the latter has initially been damaged.

A switch-on current and a switch-off current which have been reduced in this manner can thus be used to detect initial damage to the gate oxide in good time using the change in the switching times of the power transistor.

In the third exemplary embodiment, the switch activation means preferably activate the first switch and/or the second switch in the test mode in response to an externally applied test mode signal.

The switch activation means may also activate the first switch and, after a particular amount of time, the second switch in the test mode in response to a test mode signal which is externally applied to the gate drive circuit.

As already mentioned, the gate drive circuit and the power transistor may each be integrated in semiconductor chips—which are separate from one another—and be connected to one another in the common chip housing. Alternatively, the gate drive circuit and the power transistor may also be integrated in a common semiconductor chip (die).

It should be noted that the gate drive circuit according to the invention in accordance with the three exemplary embodiments can be implemented both in so-called "low-side" applications and in so-called "high-side" applications and can also be used in combination with NMOS power transistors and with PMOS power transistors as well as in combination with IGBTs.

Integrating a special test mode in a gate drive circuit according to the invention which is set up for, and in combination with, an insulated gate power transistor thus makes it possible to separately test the quality of the gate oxide. This test mode can be activated in the back end process, with the result that it is possible to detect initial damage to the gate oxide in good time.

Details of the above and further advantageous features of the invention are explained in a more precise manner in the following description relating to the drawings.

DESCRIPTION

Figure 1:
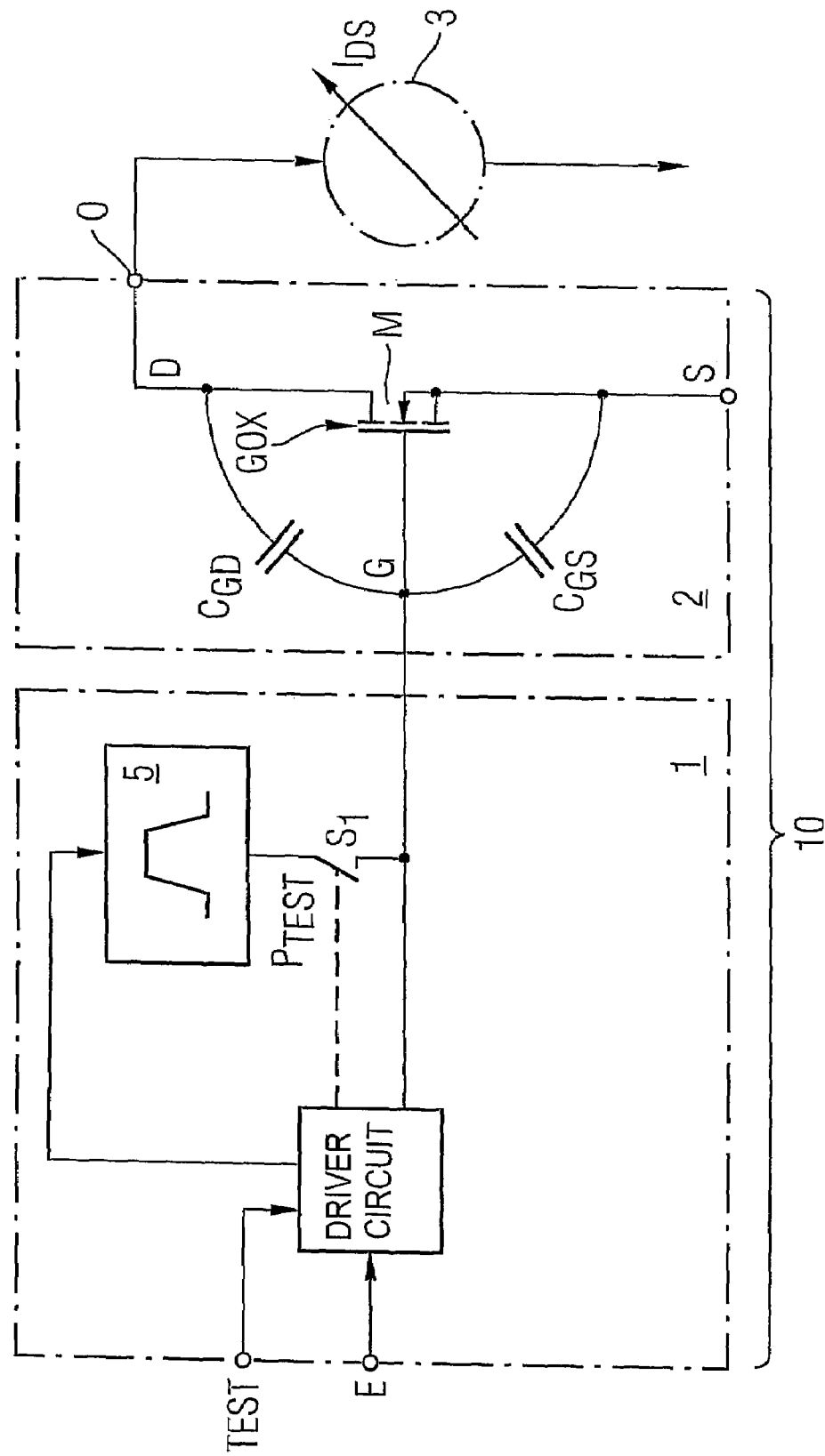
FIG. 1 diagrammatically shows a first exemplary embodiment of a gate drive circuit according to the invention which is set up to carry out a test mode which has been adapted for the purpose of testing the quality of the gate oxide of the connected power transistor.

To begin with, it should be noted that, although the figures of the drawing and the following description of the exemplary embodiments are aimed at the use of a gate drive circuit according to the invention in conjunction with a power MOS transistor, the same or equivalent exemplary embodiments may also be used for a power IGBT.

As shown in FIG. 1 which diagrammatically shows a first exemplary embodiment of a gate drive circuit 1 according to the invention in combination with, and for, a power MOS transistor M, the gate drive circuit which has been set up according to the invention is integrated in a first chip 1 (die) and the power MOS transistor M which is connected to said gate drive circuit is integrated in a second chip 2 (die) which is separate from the first. The two chips 1 and 2 are accommodated in a common chip housing 10.

According to the invention, the gate drive circuit 1 is set up to carry out a test mode which has been adapted for the purpose of testing the quality of the gate oxide GOX of the power MOS transistor M and, to this end, has a driver circuit 4 which can be activated from outside the chip 1 and an internal pulse generator circuit 5 as well as a switch S1 which can be activated by the driver circuit 4 and is intended to apply a test pulse (which is generated by the pulse generator circuit 5) to the gate G of the power MOS transistor M. The gate drive circuit 1 also receives, from outside the chip 1, at one terminal, a test mode signal TEST for activating the internal test mode and the switch S1 and, in addition, at a further input terminal, a conventional input signal E. In response to a test mode signal TEST which is applied to the driver circuit 4, the latter activates the pulse generator 5 for the purpose of generating a test pulse $P_{TEST}$ whose amplitude is higher than that of a "normal" drive pulse, and this test pulse $P_{TEST}$ is supplied to the gate terminal of the power MOS transistor M by the closed switch S1.

A damaged gate oxide GOX of the power MOS transistor M changes the gate-drain capacitance $C_{GD}$ between the gate electrode G and the drain electrode D and/or changes the gate-source capacitance $C_{GS}$ between the gate electrode G and the source electrode S of the power MOS transistor M. That is to say, in the case of damage to the gate oxide GOX, the gate is no longer insulated with respect to the source electrode and the drain electrode but rather there is an electrical connection across the oxide. A damaged gate oxide GOX of the power MOS transistor can thus be detected, for example, by measuring the drain-source current $I_{DS}$, during the test mode which is carried out by the gate drive circuit 1 according to the invention, using a measuring device 3 which is connected to the drain D (or to the source S—not shown) via a connection terminal O.

Figure 1A:
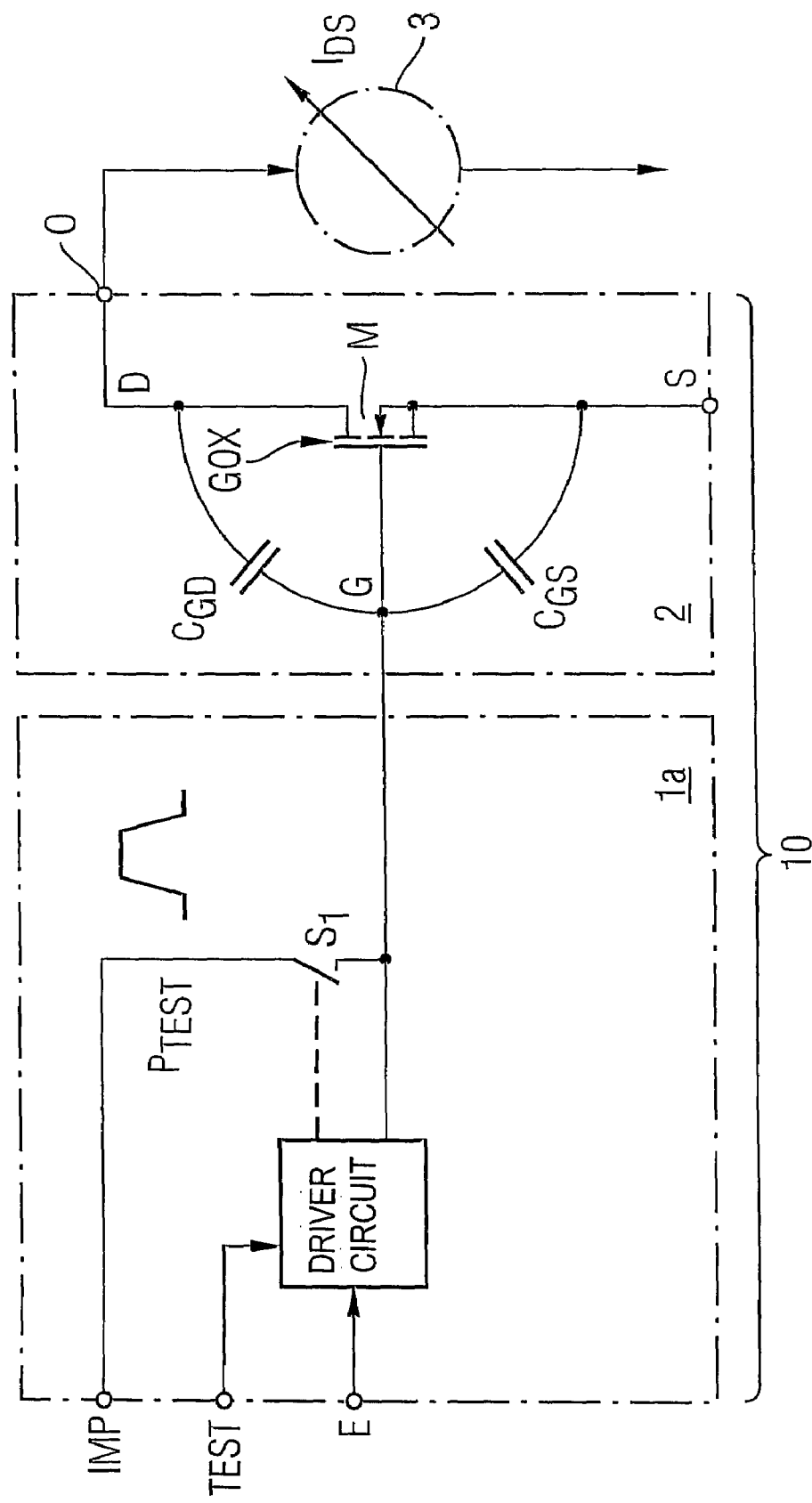
FIG. 1A diagrammatically shows a second exemplary embodiment of a gate drive circuit according to the invention which represents a variant of the first exemplary embodiment shown in FIG. 1, and FIG. 2 diagrammatically shows a third exemplary embodiment of a gate drive circuit according to the invention.

FIG. 1A diagrammatically shows a second exemplary embodiment (which has more flexibility) of a gate drive circuit 1a according to the invention in which the voltage pulse $P_{TEST}$ whose amplitude has been increased and which is used for the gate stress test is externally supplied via an external terminal IMP. The activatable driver circuit 4a is then used to switch in the test pulse $P_{TEST}$ via the switch S1.

The other details and the method of operation of the second exemplary embodiment shown in FIG. 1A are identical to those of the first exemplary embodiment of FIG. 1 and are therefore not explained separately.

Figure 2:
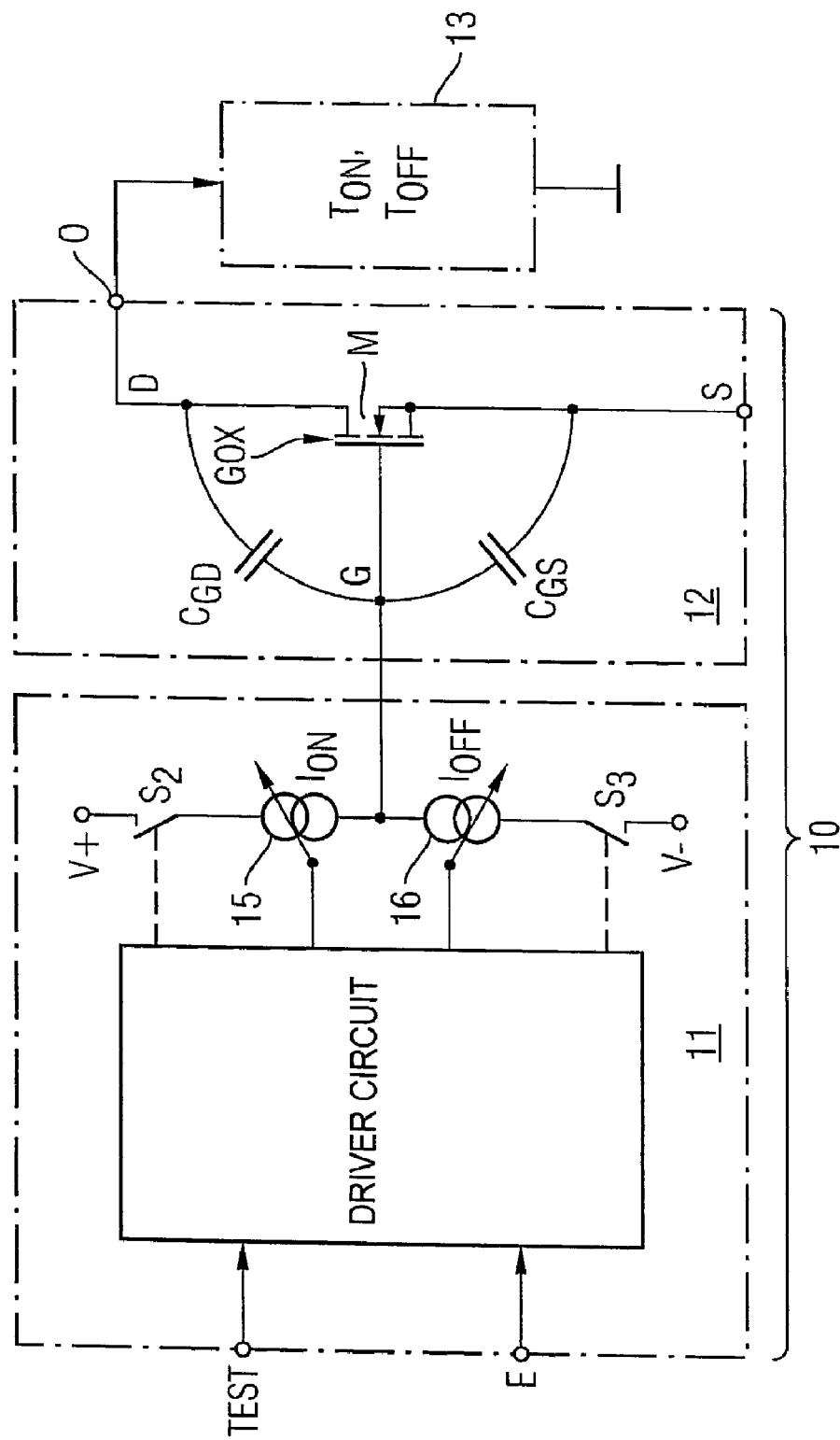

In the third exemplary embodiment (diagrammatically illustrated in FIG. 2) of a gate drive circuit 11 according to the invention, the output impedance of said drive circuit is changed in such a manner that the sensitivity for detecting initial damage to the gate oxide GOX at the gate G of the power MOS transistor M is considerably increased. To this end, the gate drive circuit 11 shown in FIG. 2 contains a first switch S2 which can be activated by a driver circuit 14 and a second switch S3 which can be activated by the driver circuit 14, a first variable current source 15 which can be switched on using the first switch S2 and is connected to the gate terminal G for the purpose of supplying a switch-on current $I_{on}$, and a second variable current source 16 which can be switched on using the second switch S3 and is likewise connected to the gate terminal G for the purpose of supplying a switch-off current $I_{off}$ having an adjustable current intensity.

The gate drive circuit 11 also has means (not shown) for respectively adjusting the current intensities of the switch-on current $I_{on}$ supplied by the first variable current source 15 and of the switch-off current $I_{off}$ supplied by the second variable current source 16. If the first variable current source 15 and/or the second variable current source 16 generate(s), during the test mode which has been activated by the test mode signal TEST in the gate drive circuit 11, a current which is as small as possible and is intended to charge and discharge the gate G of the power MOS transistor M, it is possible to detect a smaller oxide fault current from the gate G to the source electrode S or from the gate G to the drain electrode D. The current intensity of the switch-on current $I_{on}$ generated by the first variable current source 15 and the current intensity of the switch-off current $I_{off}$ generated by the second variable current source 16 are thus drastically reduced during the test mode. If the intrinsic gate-source capacitance $C_{GS}$ from the gate electrode G to the source electrode S has initially been damaged, the switched-on time $T_{on}$ which can be measured at the power MOS transistor M is considerably lengthened. Conversely, this switched-on time $T_{on}$ is considerably shortened in the case of initial damage to the gate-drain capacitance $C_{GD}$. If, instead or in addition, the switch-off current $I_{off}$ generated by the second variable current source 16 is greatly reduced during the test mode when switching off the power MOS transistor M, the switched-off time $T_{off}$ is considerably shortened in the case of initial damage to the gate-source capacitance $C_{GS}$ or the switched-off time $T_{off}$ is drastically lengthened if the gate-drain capacitance $C_{GD}$ has been increased.

In the third exemplary embodiment (illustrated in FIG. 2 and explained above) of the gate drive circuit, this makes it possible, by reducing the switch-on current $I_{on}$ and/or the switch-off current $I_{off}$, to detect initial damage to the gate oxide in good time using the change in the switching times, i.e. the switched-on time $T_{on}$ and the switched-off time $T_{off}$, of the power MOS transistor M.

In the case of the third exemplary embodiment (just explained) too, the gate drive circuit 11 according to the invention may be integrated, separately from the chip 12 having the power MOS transistor M, in its own separate chip (die) and may be accommodated in a common chip housing 10. Alternatively, as already in the first and second exemplary embodiments, the gate drive circuit and the power MOS transistor M may also be integrated in a common chip (die) here. However, this embodiment is not illustrated in the figures and is not explained in any more detail here either.

What is claimed is:

1. A circuit arrangement comprising:
an insulated gate power transistor provided in a chip housing, the power transistor including a gate terminal and a gate oxide;
a gate drive circuit provided in the chip housing, the gate drive circuit being configured for operation in a test mode adapted to test the quality of the gate oxide of the power transistor, the gate drive circuit connected to the gate terminal of the power transistor to supply a gate drive signal to the power transistor;
the gate drive circuit comprising:
a first switch configured to apply a test voltage pulse to the gate terminal of the power transistor during a particular period of time, the voltage amplitude of the test voltage pulse being higher than the amplitude of a gate voltage pulse applied during normal operation of the power transistor; and
an internal pulse generator operable to generate the test voltage pulse, wherein the gate drive circuit is operable to activate the first switch and the internal pulse generator during operation in the test mode in response to a test mode signal applied externally to the gate drive circuit.

2. A circuit arrangement comprising:
an insulated gate power transistor provided in a chip housing, the power transistor including a gate terminal and a gate oxide;
a gate drive circuit provided in the chip housing, the gate drive circuit being configured for operation in a test mode adapted to test the quality of the gate oxide of the power transistor, the gate drive circuit connected to the gate terminal of the power transistor to supply a gate drive signal to the power transistor;
the gate drive circuit comprising:
a first switch configured to apply a test voltage pulse to the gate terminal of the power transistor during a particular period of time, the voltage amplitude of the test voltage pulse being higher than the amplitude of a gate voltage pulse applied during normal operation of the power transistor; and
a test pulse terminal which leads outside the chip housing, wherein the test pulse terminal is configured to supply the test voltage pulse from a pulse generator provided outside the chip housing.

3. The circuit arrangement of claim 2 wherein the gate drive circuit is operable to activate the first switch during operation in the test mode in response to a test mode signal externally applied to the gate drive circuit.

4. A circuit arrangement comprising:
an insulated gate power transistor provided in a chip housing, the power transistor including a gate terminal and a gate oxide;
a gate drive circuit provided in the chip housing, the gate drive circuit being configured for operation in a test mode adapted to test the quality of the gate oxide of the power transistor, the gate drive circuit is connected to the gate terminal of the power transistor to supply a gate drive signal to the power transistor;

the gate drive circuit comprises:
a first switch;
a second switch;
a first variable current source connected to the gate terminal and configured to supply a switch-on current having an adjustable small current intensity to the gate terminal, the first variable current source configured to switch on using the first switch; and
a second variable current source connected to the gate terminal and configured to supply a switch-off current having an adjustable small current intensity to the gate terminal, the second variable current source configured to switch on using the second switch; and
the gate drive circuit is configured to activate the first switch and the second switch, and
to adjust the intensity of the switch-on current supplied by the first variable current source, and
to adjust the intensity of the switch-off current supplied by the second variable current source.

5. The circuit arrangement of claim 4 wherein the gate drive circuit is configured to activate the first switch or the second switch during operation in the test mode in response to an externally applied test mode signal.

6. The circuit arrangement of claim 4 wherein the gate drive circuit is configured to activate the first switch and, after a particular amount of time, the second switch during operation in the test mode in response to a test mode signal being externally applied to the gate drive circuit.

7. The circuit arrangement of claim 4 wherein the gate drive circuit is configured to adjust the intensity of the switch-on current supplied by the first variable current source and adjust the switch-off current supplied by the second variable current source during operation in the test mode such that the intensities of the switch-on current and switch-off current are much smaller than the current intensities of a respective switch-on current and switch-off current during normal operation of the power transistor.

8. The circuit arrangement of claim 1 wherein the gate drive circuit is integrated in a first semiconductor chip and the power transistor is integrated in a second semiconductor chip, wherein the first semiconductor chip is separate from the second semiconductor chip and wherein the first semiconductor chip and the second semiconductor chip are connected in the chip housing.

9. The circuit arrangement of claim 1 wherein the power transistor is an NMOS transistor.

10. The circuit arrangement of claim 1 wherein the power transistor is a PMOS transistor.

11. The circuit arrangement of claim 1 wherein the power transistor is an IGBT transistor.

12. A method for testing the quality of a gate oxide of a power transistor having a gate terminal, the method comprising:
providing the power transistor in a chip housing;
providing a gate drive circuit in the chip housing, the gate drive circuit connected to the gate terminal of the power transistor;
operating the gate drive circuit in a test mode in order to test the quality of the gate oxide of the power transistor;
generating a test voltage pulse with an internal pulse generator during operation of the gate drive circuit in the test mode; and
applying with a first switch the test voltage pulse to the gate terminal of the power transistor during operation of the gate drive circuit in the test mode, the voltage amplitude of the test voltage pulse being higher than the amplitude of a gate voltage pulse applied during normal operation of the power transistor.

13. The method of claim 12 further comprising:
measuring a drain-source current of the power transistor during operation of the gate drive circuit in the test mode.

14. A method for testing the quality of a gate oxide of a power transistor having a gate terminal, the method comprising:
providing the power transistor in a chip housing;
providing a gate drive circuit in the chip housing, the gate drive circuit connected to the gate terminal of the power transistor;
operating the gate drive circuit in a test mode in order to test the quality of the gate oxide of the power transistor;
supplying a test voltage pulse generated outside the chip housing through a test pulse terminal leading outside the chip housing during operation of the gate drive circuit in the test mode; and
applying with a first switch the test voltage pulse to the gate terminal of the power transistor during operation of the gate drive circuit in the test mode, the voltage amplitude of the test voltage pulse being higher than the amplitude of a gate voltage pulse applied during normal operation of the power transistor.

15. The method of claim 12 further comprising:
operating the gate drive circuit in the test mode in response to a test mode signal externally applied to the gate drive circuit.

16. A method for testing the quality of a gate oxide of a power transistor having a gate terminal, the method comprising:
providing the power transistor in a chip housing;
providing a gate drive circuit in the chip housing, the gate drive circuit connected to the gate terminal of the power transistor;
switching on a first variable current source connected to the gate terminal to supply a switch-on current having an adjustable small current intensity to the gate terminal, the first variable current source configured to switch on using a first switch; and
switching on a second variable current source connected to the gate terminal to supply a switch-off current having an adjustable small current intensity to the gate terminal, the second variable current source configured to switch on using a second switch; and
operating the gate drive circuit to activate the first switch and the second switch, and
to adjust the intensity of the switch-on current supplied by the first variable current source, and
to adjust the intensity of the switch-off current supplied by the second variable current source.

17. The circuit arrangement of claim 1 wherein the gate drive circuit is operable to activate the first switch and the internal pulse generator in response to a test mode signal externally applied to the gate drive circuit.

18. The circuit arrangement of claim 2 wherein the gate drive circuit is integrated in a first semiconductor chip and the power transistor is integrated in a second semiconductor chip, wherein the first semiconductor chip is separate from the second semiconductor chip and wherein the first semiconductor chip and the second semiconductor chip are connected in the chip housing.

19. The circuit arrangement of claim 4 wherein the gate drive circuit is integrated in a first semiconductor chip and the power transistor is integrated in a second semiconductor chip, wherein the first semiconductor chip is separate from the second semiconductor chip and wherein the first semiconductor chip and the second semiconductor chip are connected in the chip housing.

20. The circuit arrangement of claim 2 wherein the power transistor is an NMOS transistor.

21. The circuit arrangement of claim 4 wherein the power transistor is an NMOS transistor.

22. The circuit arrangement of claim 2 wherein the power transistor is a PMOS transistor.

23. The circuit arrangement of claim 4 wherein the power transistor is a PMOS transistor.

24. The circuit arrangement of claim 2 wherein the power transistor is an IGBT transistor.

25. The circuit arrangement of claim 4 wherein the power transistor is an IGBT transistor.

26. The method of claim 14 further comprising:

measuring a drain-source current of the power transistor during operation of the gate drive circuit in the test mode.

27. The method of claim 14 further comprising:

operating the gate drive circuit in the test mode in response to a test mode signal externally applied to the gate drive circuit.

* * * * *